United States Patent [19]

Hiral et al.

[11] Patent Number: 5,059,893
[45] Date of Patent: Oct. 22, 1991

[54] AC EVALUATION EQUIPMENT FOR AN IC TESTER

[75] Inventors: Masahisa Hiral, Kazo; Shigemi Komagata, Kitaadachi, both of Japan

[73] Assignee: Advantest Corporation, Tokyo, Japan

[21] Appl. No.: 620,788

[22] Filed: Dec. 3, 1990

[30] Foreign Application Priority Data

Dec. 6, 1989 [JP] Japan .................................. 1-316806

[51] Int. Cl.$^5$ .......................................... G01R 11/32
[52] U.S. Cl. ..................... 324/74; 324/73.1; 324/158 R; 371/571.01; 371/571.06
[58] Field of Search ................... 324/158 R, 73.1, 74, 324/130; 364/571.01, 5 A, 571.06

[56] References Cited

U.S. PATENT DOCUMENTS

| | | | |
|---|---|---|---|
| 4,541,065 | 9/1985 | Faulkner et al. | 364/571.01 |
| 4,637,020 | 1/1987 | Schivabeck | 371/22.1 |
| 4,799,008 | 1/1989 | Kannari | 374/74 |
| 4,799,175 | 1/1989 | Sano et al. | 364/571.01 |
| 4,829,236 | 5/1989 | Brenardi et al. | 324/74 |
| 4,896,282 | 1/1990 | Orwell | 364/571.01 |
| 4,989,155 | 1/1991 | Begin et al. | 364/571.06 |

Primary Examiner—Kenneth A. Wieder
Assistant Examiner—William J. Burns
Attorney, Agent, or Firm—Staas & Halsey

[57] ABSTRACT

A performance board for mounting thereon an IC under test is attached to an analog testing part of an IC tester which includes first and second AC signal generators, a DC voltage generator, a timing signal generator, a digitizer, a precision voltage measurement unit and a test processor. On the performance board there are provided an analog switch, a detector circuit, a band pass filter connected to the output of the second AC signal generator, a band elimination filter connected to the output of the first AC signal generator and a switching circuit. The analog switch outputs a rectangular-wave signal by turning ON and OFF the output DC voltage of the DC voltage operator at the frequency and with the duty ratio of a timing signal from the timing generator. The switching circuit connects the outputs of desired ones of the band pass filter, the band elimination filter, the first AC signal generator, the detector circuit and the analog switch to the inputs of desired ones of the digitizer, the precision voltage meassurement unit and the detector circuit, thereby making desired AC evaluation of the IC tester.

7 Claims, 4 Drawing Sheets

FIG. 3
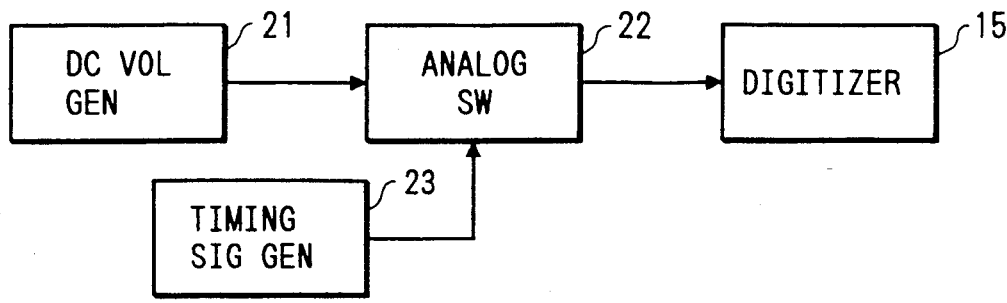
FIG. 4A
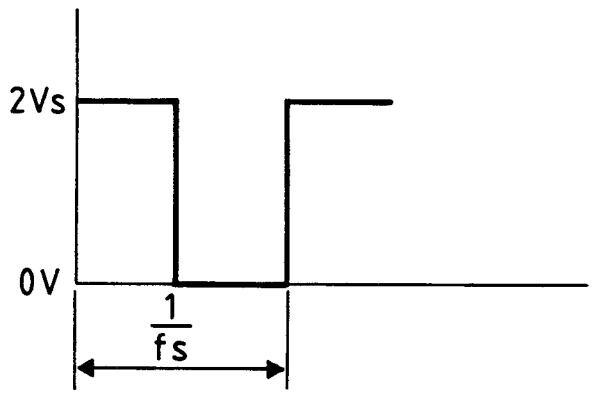
FIG. 4B
FIG. 5
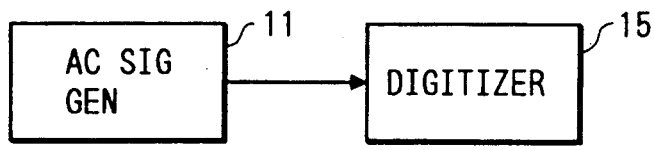

AC EVALUATION EQUIPMENT FOR AN IC TESTER

BACKGROUND OF THE INVENTION

The present invention relates to an AC evaluation equipment for checking if a signal generator and a digitizer used in an analog testing part of an IC tester are within predetermined tolerances.

In an IC tester a signal generator and a waveform analyzer are occasionally checked to see if they are still within predetermined tolerances; namely, they are subjected to an AC evaluation. If they are not within the tolerances, that is, if they are found degraded, they are repaired for accurate testing. The waveform analyzer which is usually called digitizer periodically samples an input waveform signal, converts each sample value into digital data, and subjects the data to a fast Fourier transform, then outputs the frequency components of the input waveform signal and their levels.

FIG. 1 shows a conventional arrangement for AC evaluation for the IC tester. An analog testing part 100 of the IC tester includes a plurality of AC signal generators 11 and 24, a DC voltage generator 21, a clock signal generator 17, a digitizer 15, a test processor 18, besides a voltage measurement unit (not shown) which are used primarily for analog testing of IC's. For the AC evaluation of the AC signal generator 11 or the digitizer 15 in the analog testing part 100, a standard signal generator 16, precision low-frequency and high-frequency voltage measurement units 12 and 13, and a distortion-factor meter 14 are provided outside of the analog testing part 100 and connected thereto. For example, the AC signal generator 11 to be evaluated in the analog testing part 100 is caused to generate an AC signal, which is measured by the low-frequency or high-frequency AC voltage measurement unit 12 or 13, depending on whether the AC signal is low-frequency or high-frequency, to see if the AC signal generator 11 outputs an AC signal of a predetermined amplitude within a given tolerance. Furthermore, the AC signal from the AC signal generator 11 is applied to the distortion-factor meter 14, by which the amplitudes of the fundamental wave and respective harmonics of the AC signal are measured and the ratio between the amplitudes of the fundamental wave and the highest harmonic is obtained as a distortion factor (i.e. the dynamic range or the frequency purity) to see if the dynamic range of the AC signal generator 11 is in excess of a predetermined value.

Next, an AC signal of a frequency, preset based on a clock signal, is applied from the standard signal generator 16 to the digitizer 15 to be evaluated in the analog testing part 100 of the IC tester. The accuracy of the AC level of the digitizer 15 is evaluated from its fundamental wave output level with respect to the input AC signal level and its dynamic range is evaluated from the ratio between the fundamental wave output level and a maximum output level of the other frequency components (or noise). Then, the standard signal generator 16 is caused to generate an AC signal of a different frequency and the corresponding output level of the digitizer 15 is measured to evaluate its frequency characteristic (i.e. flatness). During these measurements a clock signal of a reference frequency is supplied from the clock signal generator 17 to the standard signal generator 16 and the digitizer 15 to thereby synchronize the frequency of the AC signal from the standard signal generator 16 with the sampling frequency of the digitizer 15.

The low-frequency AC voltage measurement unit 12, the high-frequency AC voltage measurement unit 13, the distortion-factor meter 14, and the standard signal generator 16 are all high precision units calibrated according to the national standards, and hence they are costly. These devices are not needed for the IC test which is the primary object of the IC tester and they are used only for the evaluation of the AC signal generator 11 and the digitizer 15 in the analog testing part 100. In the case of evaluating them, the above-mentioned measurement units are placed under control of the test processor 18 via a GP-IB bus 19. However, since the GP-IB bus 19 is low-speed, the evaluation consumes much time, during which the IC tester has to be stopped from its test operation. In addition, the evaluation must be done periodically—this inevitably impairs the efficiency of utilization of the IC tester.

SUMMARY OF THE INVENTION

It is therefore an object of the present invention to provide a simple-structured AC evaluation equipment which precludes the necessity of employing expensive measurement units but enables various AC evaluation of an IC tester to be achieved in a short time.

According to the present invention, at least an analog switch, a detector, a band pass filter, a band elimination filter, and a switching circuit are provided on a performance board which is disposed in association with an analog testing part of the IC tester which includes at least first and second AC signal generators, a DC voltage generator, a timing signal generator, a digitizer, precision voltage measurement unit, and a test processor. A predetermined voltage from the DC voltage generator is provided to the analog switch and its ON-OFF operation is controlled, based on a timing signal of a predetermined frequency and a predetermined duty from the timing signal generator, by which a rectangular-wave signal of a predetermined level, a predetermined duty and a predetermined frequency is created. The rectangular-wave signal thus produced is applied via the switching circuit to the digitizer in the analog testing part. The AC output level and frequency characteristic of the digitizer can be evaluated, based on theoretical values of the levels of respective frequency components of the rectangular-wave signal. By applying an AC signal from the first AC signal generator via the switching circuit to the digitizer evaluated to be within a predetermined tolerance, the frequency characteristic of the first AC signal generator in the low-frequency region can be evaluated from the output level of the digitizer. By generating from the first AC signal generator an AC signal of a frequency region higher than the above-mentioned low-frequency region, applying the AC signal via the switching circuit to the detector of a calibrated input/output characteristic and then measuring the detector output by the calibrated precision voltage measurement unit, the frequency characteristic of the first AC signal generator in the high-frequency region. By applying an AC signal from the second AC signal generator via the band pass filter and the switching circuit to the digitizer, its dynamic range can be evaluated from the output level of the fundamental wave component of the AC signal and the output levels of other frequency components (noise) which are provided from the digitizer. Further, the AC signal from the first AC signal generator is applied to the band elimination filter which eliminates its fundamental wave component, and the output of the band elimination filter and the AC signal not applied thereto are selectively applied via the switching circuit to the digitizer evaluated to be within a predetermined tolerance, by which the dynamic range (or the frequency purity) of the first AC signal generator can be evaluated from the digitizer output.

DESCRIPTION OF THE DRAWINGS

FIG. 3 is a block diagram showing an example of an arrangement for evaluating the AC level and frequency characteristic of a digitizer in the evaluation equipment of the present invention;

FIG. 4A is a waveform diagram of a rectangular-wave signal which is used for the evaluation in FIG. 3;

FIG. 4B is a diagram showing its frequency spectrum;

FIG. 5 is a block diagram showing an example of an arrangement for evaluating the frequency characteristic of a signal generator in the low-frequency region in the evaluation equipment of the present invention;

DESCRIPTION OF THE PREFERRED EMBODIMENT

Now, a description will be given, with reference to the drawings, of the AC evaluation system for an IC tester according to the present invention.

Figure 1:
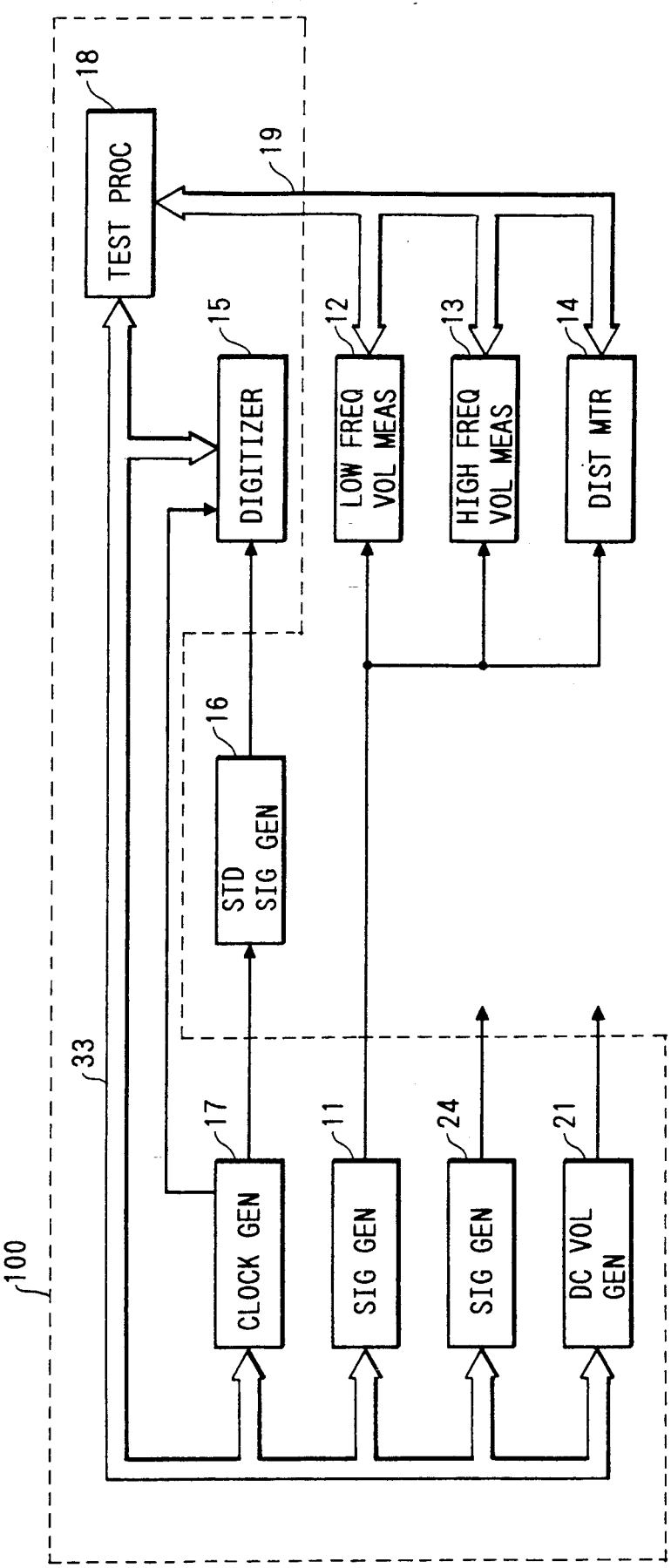
FIG. 1 is a block diagram showing a conventional AC evaluation arrangement.
Figure 2:
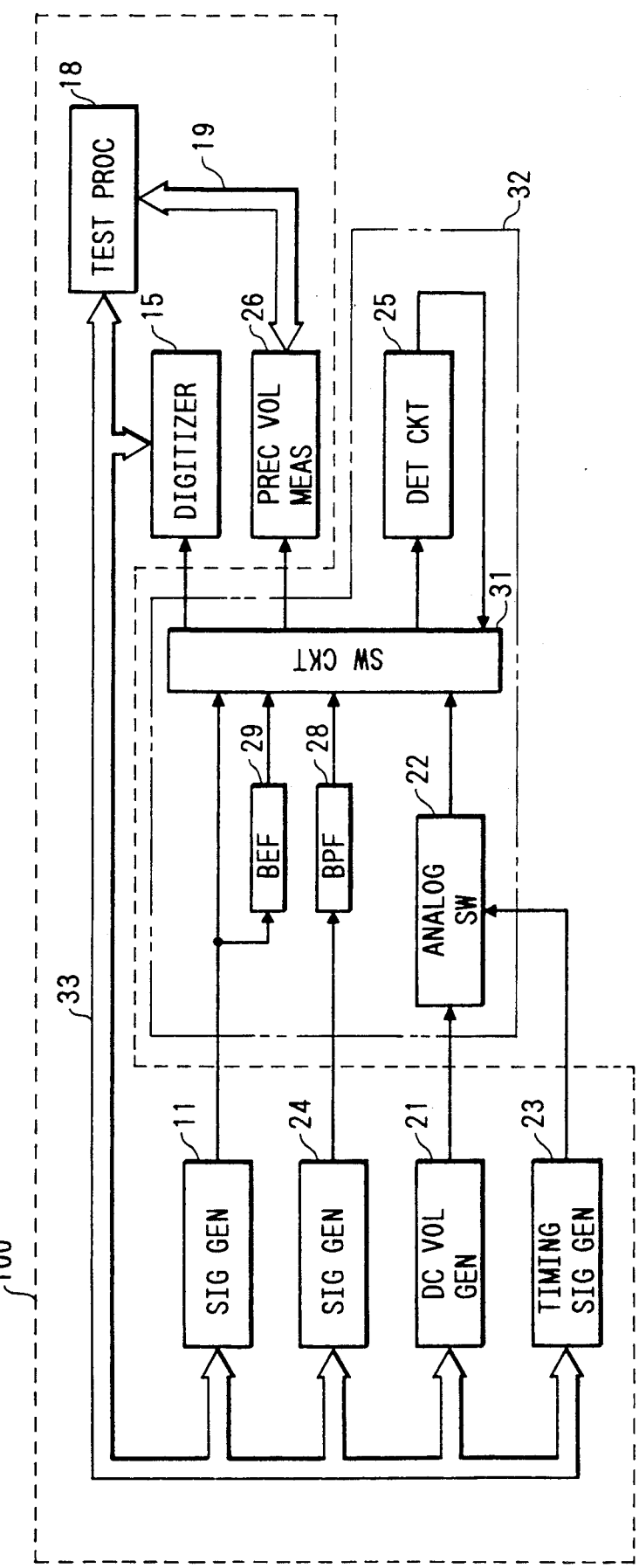
FIG. 2 is a block diagram illustrating an example of the construction of the evaluation equipment according to the present invention.

FIG. 2 illustrates in block form an embodiment of the AC evaluation equipment for an IC tester according to the present invention, in which the parts corresponding to those in FIG. 1 are identified by the same reference numerals. The analog testing part 100 of the IC tester includes the plurality of AC signal generators 11 and 24, the DC voltage generator 21, a timing signal generator 23, the digitizer 15, the test processor 18 and a precision voltage measurement unit 26 which are intended primarily for the analog test of IC's. Usually the analog testing part 100 has mounted thereon a performance board 32, on which sockets (not shown) are disposed for receiving IC's to be tested. In addition, according to the present invention, there are provided on the performance board 32 an analog switch 22, a detector circuit 25, a band pass filter 28, a band elimination filter 29 and a switching circuit 31 as shown in FIG. 2.

The AC signal generator 11 generates an AC signal (a sine wave) of a frequency and level set by the test processor 18 via a tester bus 33. The AC signal is applied to the switching circuit 31 directly and via the band elimination filter 29. The AC signal generator 24 generates an AC signal of a frequency and level set by the test processor 18, which signal is provided via the band pass filter 28 to the switching circuit 31. The DC voltage generator 21 generates, with high precision, a DC voltage of a level set by the test processor 18 and applies it to the analog switch 22. A timing signal generator 23 creates a timing signal of a frequency and a duty ratio set by the test processor 18. The timing signal from the timing signal generator 23 is provided, as an ON-OFF control signal, to the analog switch 22, causing it to produce a rectangular-wave signal of the same amplitude as that of the DC voltage from the DC voltage generator 21 and of the same frequency and duty ratio as those of the timing signal. The rectangular-wave signal thus produced is applied to the switching circuit 31. The switching circuit 31 is constructed so that it can supply desired ones of the outputs of the AC signal generator 11, the band elimination filter 29, the band pass filter 28, the analog switch 22 and the detector circuit 25 to desired ones of the digitizer 15, the precision voltage measurement unit 26 and the detector circuit 25. Incidentally, the band pass filter 28 and the band elimination filter 29 are mounted on the performance board 32 so that filters of different center frequencies can be replaced as required. Various AC evaluation which can be made by such an AC evaluation equipment for an IC tester according to the present invention will hereinafter be described with respect to principal constituent members used for each evaluation, shown in FIG. 2.

(A) Low-Frequency Output Level Evaluation of the Digitizer

FIG. 3 illustrates an example of the connection arrangement for evaluating the AC level and frequency characteristic (or flatness) of the digitizer 15 in the low-frequency region, for example, lower than 100 KHz. The DC voltage generator 21 in the analog testing part 100 generates a preset DC voltage with high precision, which is applied to the analog switch 22. On the other hand, the timing signal generator 23 in the analog testing part 100 generates a rectangular-wave signal of a predetermined duty ratio and a predetermined frequency (100 KHz or below), which is applied to the analog switch 22 to control its ON-OFF operation. In the case of a relatively low frequency lower than 100 KHz, it is possible to produce a high-precision rectangular-wave signal with such a simple constitution. The rectangular-wave signal from the analog switch 22 is provided to the digitizer 15. The frequency of the rectangular-wave signal from the timing signal generator 23 and the sampling frequency of the digitizer 15 are synchronized with each other.

Now, assuming that the output voltage of the DC voltage generator 21 is 2 Vs, the duty ratio of the rectangular-wave signal generated by the timing signal generator 23 is 50% and its frequency is fs, the output of the analog switch 22 will become a rectangular-wave signal which alternates between voltages 2 Vs and 0 V and has the duty ratio of 50% and the frequency fs as shown in FIG. 4A. Generally speaking, frequency components contained in the rectangular-wave signal and their levels can theoretically be calculated, if its amplitude, duty ratio and frequency are known. In the example of FIG. 4A the frequency components are the fundamental wave fs and harmonics 3fs, 5fs, ... and theoretical values of their levels are 4 Vs/$\pi$, 4 Vs/3$\pi$, 4 Vs/5$\pi$, ..., as shown in FIG. 4B. The output level of the digitizer 15 at the fundamental frequency fs and the corresponding theoretical value 4 Vs/$\pi$ are compared to evaluate the AC level accuracy of the digitizer 15 (i.e. to determine whether the error between the output level and the theoretical value is within a given limit range). The output levels of the digitizer 15 at the fundamental wave fs and the harmonics 3fs, 5fs, . . . and the corresponding theoretical values are compared to evaluate the frequency characteristic (or flatness) of the digitizer 15.

(B) Low-Frequency Output Level Evaluation of the AC signal Generator

As depicted in FIG. 5, an AC signal from the AC signal generator 11 in the IC tester is applied to the digitizer 15 determined to be within a predetermined tolerance by the above-described evaluation in the low-frequency region. In this instance, the frequency of the AC signal is varied within the low-frequency region, and for the individual frequencies, the outputs of the corresponding fundamental frequency components of the digitizer 15 are measured to thereby evaluate the frequency characteristic of the AC signal generator 11 in the low-frequency region.

(C) High-Frequency Output Level Evaluation of the AC Signal Generator

Figure 6:
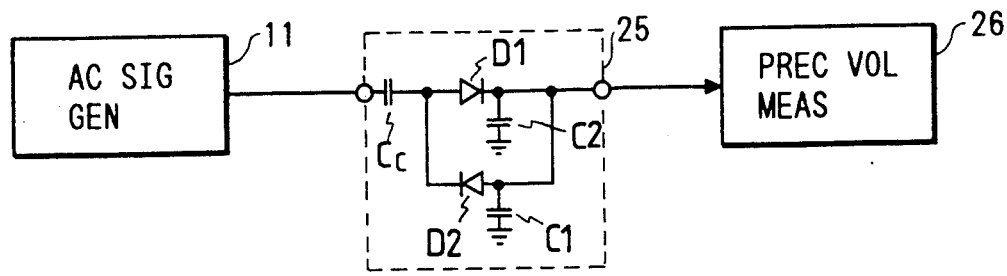
FIG. 6 is a block diagram showing an example of an arrangement for evaluating the frequency characteristic of the signal generator in the highfrequency region in the evaluation equipment of the present invention.

As shown in FIG. 6, a plurality of AC signals of different frequencies in a frequency region (above 100 KHz in this example) higher than the above-said low-frequency region are applied one by one to the detector circuit 25 having its input/output characteristic calibrated and its output voltage is measured by the calibrated precision voltage measurement unit 26 in the IC tester. In this way, the output voltage of the AC signal generator 11 at the plurality of frequencies in the high-frequency region are measured to evaluate the frequency characteristic of the AC signal generator 11 in the high-frequency region. The calibration of the input/output characteristic of the detector circuit 25 is carried out in the following manner: An AC signal of a relatively low frequency, for example, the same frequency as the frequency fs used for the evaluation described above in respect of FIG. 3, is provided from the AC signal generator 11, for instance, to the evaluated digitizer 15 and the detector circuit 25, the output of the detector circuit 25 at that time is measured by the calibrated precision voltage measurement unit 26, and the measured value is calibrated by the output level of the evaluated digitizer 15. The detector circuit 25 is a well-known and simple-structured device composed of diodes D1 and D2 and capacitors Cc, C1 and C2 as shown in FIG. 6 and its input/output frequency characteristic is flat over a wide band; therefore, a value calibrated at a single low frequency can be applied to the high-frequency region.

(D) Evaluation of the Dynamic Range of the Digitizer

Figure 7:
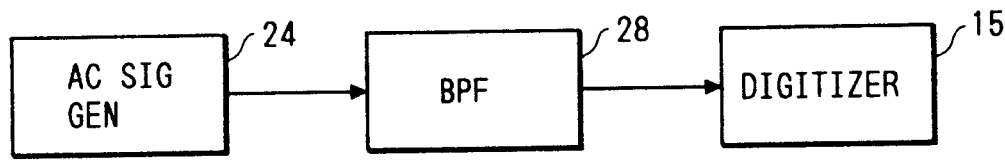
FIG. 7 is a block diagram illustrating an example of an arrangement for evaluating the dynamic range of the digitizer in the evaluation equipment of the present invention.

As depicted in FIG. 7, an AC signal from the AC signal generator 24 in the analog testing part 100 is applied to the band pass filter 28, wherein its fundamental wave component is extracted, that is, a sine-wave signal of a high frequency purity is produced, and the sine-wave signal is supplied to the digitizer 15. From the output level Vs of the fundamental wave component of the digitizer 15 and a maximum level Vn of other frequency components (noise) the dynamic range Vs/Vn of the digitizer 15 is calculated and it is checked whether or not its value is in excess of a predetermined value; thus, the dynamic range of the digitizer 15 is evaluated. For this evaluation the output level of the AC signal generator 24 is suitably selected for each input level range of the digitizer 15. The band pass filter 28 is used to retain a measurement error of the dynamic range of the digitizer 15 within a predetermined limit range by increasing the dynamic range of the AC signal range provided from the AC signal generator 24. Consequently, the evaluation method described above in respect of FIG. 7 is particularly effective when the dynamic range of the digitizer 15 is relatively large as compared with the dynamic range of the AC signal generator 24.

(D) Evaluation of the Dynamic Range of the AC Signal Digitizer

Figure 8:
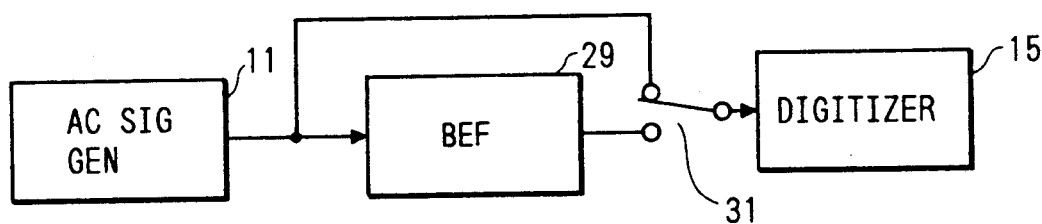
FIG. 8 is a block diagram showing an example of an arrangement for evaluating the dynamic range of the signal generator in the evaluation equipment of the present invention.

FIG. 8 illustrates an arrangement for evaluating the dynamic range of the AC signal generator 11. The AC signal from the AC signal generator 11 is applied to the band elimination filter 29 which eliminates the fundamental wave component of the AC signal, and the output of the AC signal generator 11 and the output of the band elimination filter 29 are selectively applied via the switching circuit 31 to the evaluated digitizer 15. In the digitizer 15 the fundamental wave level of the output AC signal from the AC signal generator 11 and the maximum harmonic component level of the AC signal available at the output of the band elimination filter 29 are measured and their ratio is obtained to thereby evaluate the dynamic range of the AC signal generator 11. Where the dynamic range of the AC signal generator 11 is larger than the dynamic range of the digitizer 15, the measurement sensitivity (or input range) of the digitizer 15 is changed to enlarge the apparent dynamic range prior to the measurement. That is, in the case of measuring the fundamental wave level with the digitizer 15 connected via the switching circuit 31 to the AC signal generator 11, the sensitivity of the digitizer 15 is lowered, whereas in the case of measuring the level of the harmonic component with the digitizer 15 connected via the switching circuit 31 to the band elimination filter 29, the sensitivity of the digitizer 15 is raised.

In the AC evaluation (A) through (E) described above, as depicted in FIG. 2, the test processor 18 controls, via the tester bus 33, the setting of various values for the AC signal generators 11 and 24, the timing signal generator 23 and the DC voltage generator 21 and transmits data to and receives from the digitizer 15. The test processor 18 has stored therein reference values necessary for the various evaluation and, based on these reference values and data received from the digitizer 15 and the precision voltage measurement unit 26, evaluates the AC measured levels and the frequency characteristics in the above-described evaluation (A) through (E), or evaluates the dynamic ranges by calculating and comparing their values with the corresponding reference values.

The analog testing part 100 of an IC tester usually includes a plurality of AC signal generators, accordingly the frequency characteristic of the AC signal generator which generates only low-frequency signals is evaluated using the arrangement shown in FIG. 5, and the frequency characteristic of the AC signal generator which generates only high-frequency signals is evaluated using the arrangement shown in FIG. 6. Since in the IC tester a rectangular-wave drive signal can be obtained from a driver (not shown) for driving an IC under test, it is possible to make evaluation similar to that shown in FIG. 2, by applying the rectangular-wave drive signal from the driver to the digitizer 15. In the case where the analog testing part 100 includes a function generator capable of generating a rectangular wave, the analog switch 22 in FIG. 3 may be controlled directly by a rectangular-wave signal which is obtained from the function generator in synchronization with the sampling frequency of the digitizer 15. Some of the AC signal generators in the analog testing part 100 are of appreciably high precision, and although only one digitizer is shown in FIG. 1, the testing part 100 also includes a plurality of digitizers, some of which are relatively low in the required precision. It is therefore possible, in the evaluation mentioned above with respect to FIG. 7, to apply an AC signal from such a high precision AC signal generator directly to the digitizer of relatively low precision without passing through the band pass filter 28.

As described above, according to the present invention, if the precision voltage measurement unit 26 is periodically calibrated, a simple-structured, low-cost AC evaluation equipment can be constructed simply by additionally providing, for instance, the analog 22, the detector circuit 25, the filters 28 and 29 and the switching circuit 31 on the performance board 32 as shown in FIG. 2. This means that the present invention permits evaluation of AC signal generators and digitizers without employing many expensive measurement units calibrated according to the national standards as in the prior art method depicted in FIG. 1. Moreover, the evaluation can be achieved within the IC tester and the number of measurement units to be controlled via the GP-IB bus 19 is so small (only the voltage measurement unit 26 in the case of FIG. 2) that the evaluation can be made in a short time; consequently, the efficiency of utilization of the IC tester can be improved accordingly.

It will be apparent that many modifications and variations may be effected without departing from the scope of the novel concepts of the present invention.

What is claimed is:

1. An IC evaluation equipment for an IC tester, comprising:

an analog testing part of said IC tester including: first and second AC signal generators for AC signals of preset frequencies and levels; a DC voltage generator for generating a DC voltage of a preset level; a timing signal generator for generating a- timing signal of a preset frequency and duty ratio; a digitizer for analyzing frequency components of an input signal waveform and their levels; a precision voltage measurement unit for measuring a DC voltage with high precision; and a test processor connected via bus means to said first and second AC signal generator, said DC voltage generator, said timing signal generator, said digitizer and said precision voltage measurement unit, for controlling them and for processing measured data received from said digitizer and said precision voltage measurement unit;

a performance board attached to said analog testing part, for mounting thereon IC's to be tested;

an analog switch provided on said performance board and connected to the outputs of said DC voltage generator and said timing signal generator, whereby a rectangular-wave signal of the frequency and duty ratio of said timing signal input thereinto is output at the level corresponding to said DC voltage input thereinto;

a detector circuit provided on said performance board;

a band pass filter provided on said performance board and connected to the output of said second AC signal generator;

a band elimination filter provided on said performance board and connected to the output of said first AC signal generator; and a switching circuit provided on said performance board, for connecting the outputs of desired ones of said analog switch, said detector circuit, said band pass filter, said band elimination filter and said first AC signal generator to the inputs of desired ones of said detector circuit, said digitizer and said precision voltage measurement unit.

2. The AC evaluation equipment of claim 1., wherein said bus means includes a tester bus for connecting said first and second AC signal generators, said DC voltage generator, said timing signal generator and said digitizer to said test processor.

3. The AC evaluation equipment of claim 1, wherein in the case of evaluating the AC output level and frequency characteristic of said digitizer, the output of said analog switch is connected via said switching circuit to the input of said digitizer to input thereinto said rectangular-wave signal and said test processor evaluates the AC output level and frequency characteristic of said digitizer, based on a theoretical value of the level of each frequency component of said rectangular-wave signal.

4. The AC evaluation equipment of claim 1, wherein in the case of evaluating the output level of said first AC signal generator in a low-frequency region, the output of said first AC signal generator is connected via said switching circuit to the input of said digitizer and said test processor evaluates the output level of said first AC signal generator in said low-frequency region, based on the measured output level by said digitizer.

5. The AC evaluation equipment of claim 1, wherein in the case of evaluating the output level of said first AC signal generator in a high-frequency region, the output of said first AC signal generator is connected via said switching circuit to the input of said detector circuit, the output of said detector circuit is connected via said switching circuit to the input of said precision voltage measurement unit, and said test processor evaluates the output level of said first AC signal generator in said high-frequency region, based on the measured output level of said precision voltage measurement unit.

6. The AC evaluation equipment of claim 1, wherein in the case of evaluating the dynamic range of said digitizer, the output of said band pass filter is connected via said switching circuit to the input of said digitizer to supply thereto an AC signal and said test processor evaluates the dynamic range of said digitizer by calculating it from the level of the fundamental wave component and the levels of other frequency components of said AC signal output from said digitizer.

7. The AC evaluation equipment of claim 1, wherein in the case of evaluating the dynamic range of said first AC signal generator, the output of said first signal generator is connected via said switching circuit to the input of said digitizer to supply thereto an AC signal to measure the level of the fundamental wave component of said AC signal, the output of said band elimination filter is connected via said switching circuit to the input of said digitizer to measure levels of other frequency components of said AC signal than said fundamental wave component and said test processor evaluates the dynamic range of said first AC signal generator by calculating it from said measured levels.

* * * * *

UNITED STATES PATENT AND TRADEMARK OFFICE
CERTIFICATE OF CORRECTION

PATENT NO. : 5,059,893

DATED : Oct. 22, 1991

INVENTOR(S) : Hirai et al.

It is certified that error appears in the above-identified patent and that said Letters Patent is hereby corrected as shown below:

On the title page:
Under item [19] and item [75] "Hiral" s/b --Hirai--;
[56] line 4, "Schivabeck" s/b --Schinabeck--.
[57] ABSTRACT, line 19, "meassurement" s/b --measurement--.
Col. 3, line 30, "highfrequency" should be --high-frequency--.
Col. 7, line 46, "a- timing" should be --a timing--;

Signed and Sealed this

Second Day of February, 1993

Attest:

STEPHEN G. KUNIN

Attesting Officer        Acting Commissioner of Patents and Trademarks